(12) United States Patent
Choi et al.

(10) Patent No.: US 6,696,862 B2
(45) Date of Patent: Feb. 24, 2004

(54) SEMICONDUCTOR MEMORY DEVICE INPUT CIRCUIT

(75) Inventors: Dong-Jun Choi, Seoul (KR); Dae-Hyun Chung, Kyungki-do (KR); Sang-Jun Hwang, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 53 days.

(21) Appl. No.: 10/108,668

(22) Filed: Mar. 27, 2002

(65) Prior Publication Data

US 2002/0158669 A1 Oct. 31, 2002

(30) Foreign Application Priority Data

Apr. 27, 2001 (KR) ........................................ 2001-22982

(51) Int. Cl.[7] .............................................. H03K 19/096
(52) U.S. Cl. ............................ 326/93; 326/95; 365/228
(58) Field of Search ..................... 326/93, 95; 365/226, 365/228, 189.02, 203, 230.02, 230.08

(56) References Cited

U.S. PATENT DOCUMENTS 6,061,292 A * 5/2000 Su et al. ................. 365/230.06
6,069,829 A * 5/2000 Komai et al. ................ 365/201
2001/0055344 A1  12/2001 Lee et al.

* cited by examiner

*Primary Examiner*—Daniel Chang
(74) *Attorney, Agent, or Firm*—Marger Johnson & McCollom, P.C.

(57) ABSTRACT

A semiconductor memory device input circuit including a clock selection portion. The clock selection portion receives an internal clock signal before a data strobe signal is enabled. The input circuit includes a plurality of input buffers, a clock selection circuit, a calibration circuit, and a plurality of data registers. The clock selection circuit receives a selection signal that is maintained at a first logic level for a predetermined time from the time when power is initially supplied and has a second logic level. The clock selection circuit selects a first clock signal and outputs the first clock signal as a second clock signal when the selection signal is maintained at the first logic level. The clock selection circuit selects the data strobe signal and outputs the data strobe signal as the second clock signal when the selection signal is maintained at the second logic level.

11 Claims, 3 Drawing Sheets

SEMICONDUCTOR MEMORY DEVICE INPUT CIRCUIT

This application claims priority from Korean Patent Application No. 01-22982, filed Apr. 27, 2001, herein incorporated by reference.

BACKGROUND OF THE INVENTION

1. Field of the Invention

The present invention relates to a semiconductor memory device and, more particularly, to a semiconductor memory device input circuit.

2. Description of the Related Art

The operation frequency of semiconductor memory devices is continuously improving with advances in the related technology. A setup/hold window during which data is input, consequently decreases. To address this issue, a method for tracking input data using a data strobe signal has been suggested for a double data rate (DDR) synchronous dynamic random access memory (SDRAM).

FIG. 1 is a circuit diagram of a semiconductor memory device input circuit 100. Referring to FIG. 1, the input circuit 100 includes a plurality of input buffers 101 through 107, a calibration circuit 109, and a plurality of data registers 111 through 115. One of the functions of the input circuit 100 is to store a plurality of input data D0 through Di in the corresponding registers 111 through 115, respectively, within a predetermined time.

The calibration circuit 109 is a signal transmission circuit for synchronizing different delay characteristics. The calibration circuit 109 generates a controlling clock signal for controlling the data strobe signal DQS responsive to a data strobe signal DQS. The calibration circuit 109 synchronizes the input data D0, D1 through Di with different delay times according to an input path. The calibration circuit is explained in further detail in Korean Patent Application No. 10-2000-0035335, incorporated herein by reference.

The input data D0, D1 through Di, are transmitted to the corresponding registers with different delay times owing to the arrangement characteristics of circuits and elements. The controlling clock signal used in storing the input data in the corresponding registers is generated in the calibration circuit 109 responsive to the data strobe signal DQS. The controlling clock signal synchronizes with the input data such that the input data are stored in the corresponding registers within a predetermined time. Thus the plurality of input data D0 through Di is stored in the corresponding registers 111 to 115 responsive to the signal output by the calibration circuit 109.

The data strobe signal DQS is enabled responsive to an active write command (not shown). Thus, the signal DQS is not generated before a first write operation. And the controlling clock signal for storing the input data in the corresponding registers 111 through 115 within a predetermined time cannot be generated in the calibration circuit 109 using the data strobe signal DQS from the time the power is turned on to the first write operation.

SUMMARY OF THE INVENTION

It is an object of the present invention to overcome the disadvantages associated with known semiconductor memory devices.

It is another object of the present invention to provide semiconductor memory device input circuit including a clock selection portion for preventing malfunction of the input circuit from the time when power is initially turned on to the time when a data strobe signal is enabled.

It is yet another object of the present invention to provide a method for selecting a clock signal implemented in the input circuit of a semiconductor memory device to prevent malfunction from the time when power is initially turned on to the time when a data strobe signal is enabled.

Accordingly, an input circuit for a semiconductor memory device is provided. The input circuit includes a plurality of input buffers adapted to buffer corresponding input data and a clock selection circuit adapted to generate a second clock signal by selecting between a first clock signal and a data strobe signal responsive to a selection signal, the selection signal being maintained at a first logic level for a predetermined time after power up. A calibration circuit is adapted to generate a register clock signal responsive to the second clock signal.

And a plurality of data registers is adapted to store buffered input data responsive to the register clock signal.

The clock selection circuit might output the first clock signal as a second clock signal when the selection signal is at a first logic level and the clock selection circuit might output the data strobe signal as the second clock signal when the selection signal is at a second logic level.

In one embodiment, the clock selection circuit includes a first PMOS transistor having a first end connected to a supply voltage and a gate adapted to receive the selection signal and a first buffer having a first input adapted to receive the data strobe signal, a second input adapted to receive a reference voltage, and a third input being connected to a second end of the first PMOS transistor. A first NMOS transistor has a first end connected to an output terminal of the first buffer, a second end connected to ground, and a gate adapted to receive the selection signal. A second buffer has a first input adapted to receive a first clock signal and a second input adapted to receive an inverted clock signal. An inverter has an input terminal connected to the output terminal of the first buffer. A first logic gate is adapted to logically manipulate the selection signal and an output signal of the second buffer. And a second logic gate is adapted to logically manipulate an output signal of the first logic gate and an output signal of the first inverter.

In one embodiment, the predetermined time is a time between power up and a mode register set signal being enabled.

In one embodiment, the predetermined time is a time between power up and the data strobe signal being enabled.

A method for selecting a clock signal in an input circuit for a semiconductor memory device is also provided. The method includes providing a first clock signal as a second clock signal responsive to a selection signal being in a first logic state, providing a data strobe signal as the second clock signal responsive to the selection signal being a second logic state, generating a register clock signal responsive to the second clock signal, and registering the input data responsive to the register clock.

The method might further include setting the selection signal to the second logic state a predetermined time after power up.

The method might further include setting the selection signal to the first logic state after enabling a mode set register signal and setting the selection signal to the second logic state after enabling the data strobe signal.

BRIEF DESCRIPTION OF THE DRAWINGS

The above objects and advantages of the present invention will become more apparent by describing in detail a preferred embodiment thereof with reference to the attached drawings.

DETAILED DESCRIPTION OF THE INVENTION

Figure 1:
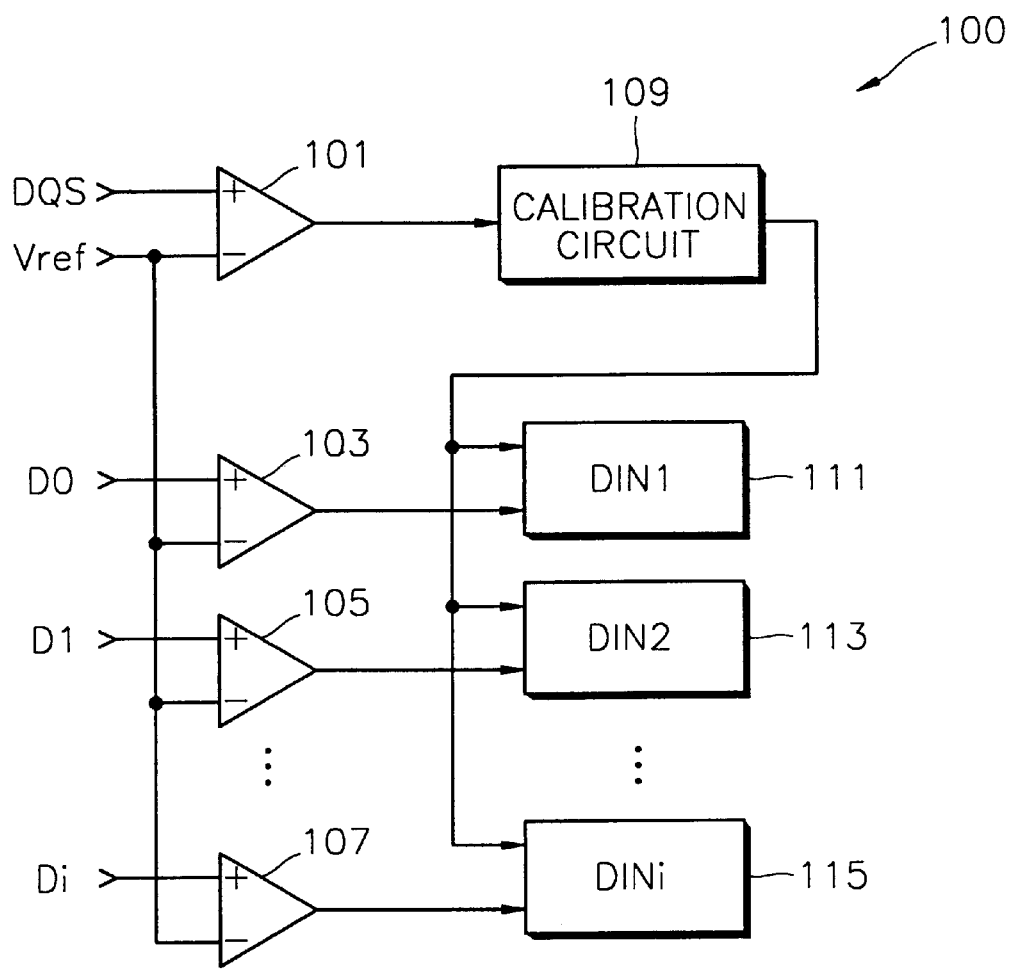
FIG. 1 is a block diagram of a semiconductor memory device input circuit 100.

An embodiment of the present invention will be described in detail with reference to the accompanying drawings. Like reference numerals refer to like elements throughout the drawings.

Figure 2:
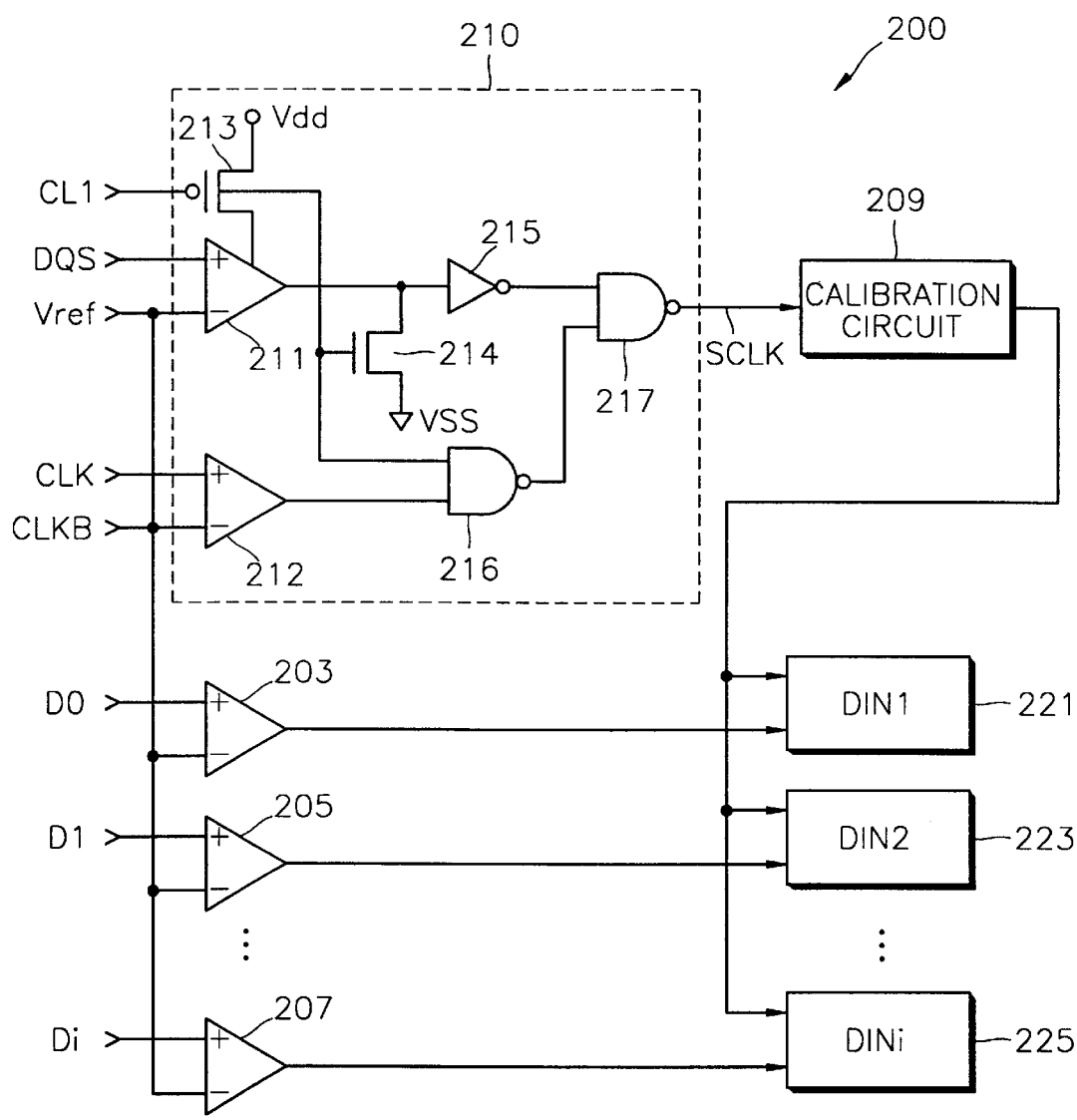
FIG. 2 is block diagram of an embodiment of a semiconductor memory device input circuit according to the present invention.

FIG. 2 is block diagram of an embodiment of a semiconductor memory device input circuit according to the present invention. Referring to FIG. 2, an input circuit 200 includes a plurality of input buffers 203 through 207, a clock selection circuit 210, a calibration circuit 209, and a plurality of data registers 221 through 225.

Input data provided through the input buffers 203 through 207 is stored in the corresponding data registers 221 through 225 responsive to a signal output from the calibration circuit 209.

The calibration circuit 209 is a signal transmission circuit for synchronizing different delay characteristics. The calibration circuit 209 receives a second clock signal SCLK generated by the clock selection circuit 210. The calibration circuit 209 outputs a controlling clock signal for synchronizing input data D0, D1 through Di with different delay times according to an input path.

The input data D0, D1 through Di, have different delay times owing to the arrangement characteristics of circuits and elements. The input data D0, D1, through Di is transmitted to the corresponding registers 221 to 225. The controlling clock signal, used to store the input data in the corresponding registers. The controlling clock signal is generated by the calibration circuit 209 responsive to the second clock signal SCLK. The controlling clock signal synchronizes with the input data such that the input data is stored in the corresponding registers within a predetermined time.

The plurality of input data DO through Di is stored in the corresponding registers 221 to 225 responsive to the signal output from the calibration circuit 209.

The clock selection circuit 210 includes a first PMOS transistor 213, a first buffer 211, a first NMOS transistor 214, a second buffer 212, a first inverter 215, a first NAND gate 216, and a second NAND gate 217.

One end of the first PMOS transistor 213 is connected to a power supply voltage Vdd. The gate of the first PMOS transistor 213 is connected to a selection signal CL1. A data strobe signal DQS is applied to a first input terminal of the first buffer 211 and a reference voltage Vref is applied to a second input terminal. The operation of the first buffer 211 is controlled by current supplied from the other end of the first PMOS transistor 213. One end of the first NMOS transistor 214 is connected to an output terminal of the first buffer 211 and the other end thereof is connected to the ground voltage Vss. The selection signal CL1 is applied to the gate of the first NMOS transistor 214.

A first clock signal CLK is applied to one input terminal of the second buffer 212 and an inverted signal CLKB is applied to the other input terminal. The input terminal of the first inverter 215 is connected to the output terminal of the first buffer 211. The first NAND gate 216 responds to the selection signal CL1 and an output signal of the second buffer 212. The second NAND gate 217 outputs the second clock signal SCLK responsive to an output signal of the first inverter 215 and an output signal of the first NAND gate 216.

Figure 3:
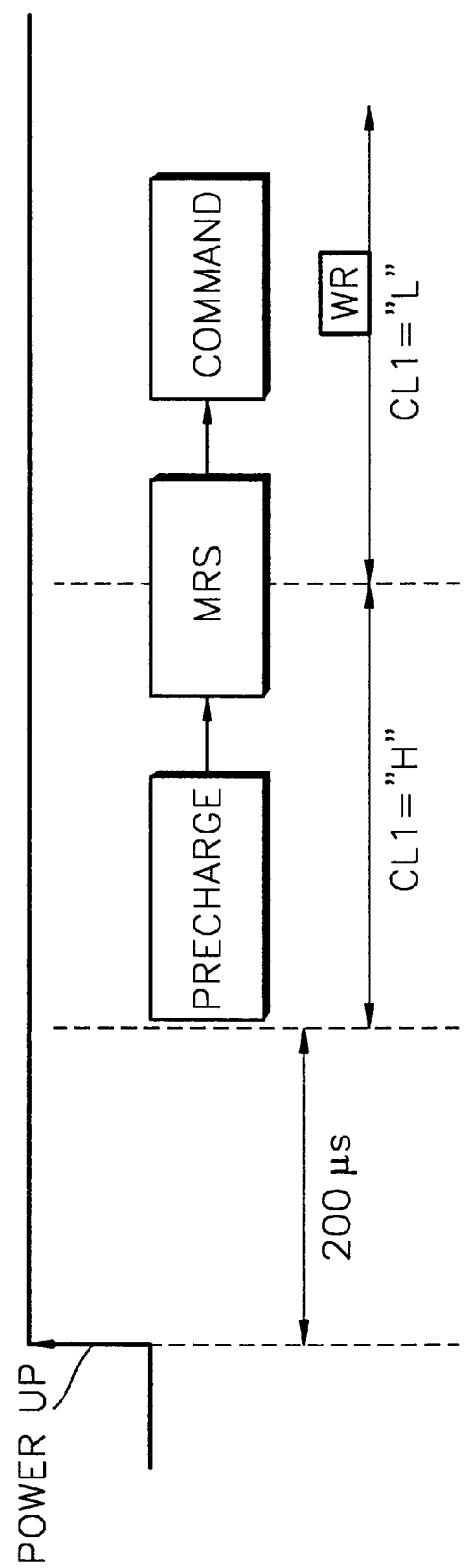
FIG. 3 is a timing diagram of the operation of the input circuit shown in FIG. 2.

FIG. 3 is a timing diagram of the operation of the input circuit of a semiconductor memory device. Referring to FIG. 3, the value of the selection signal CL1 is maintained in a high state "H" until power is turned on and pre-charged after a predetermined non-operation period (e.g., 200 μSec) while a mode register set (MRS) is set to a predetermined value. If the MRS is set to a predetermined value, the value of the signal CL1 is changed into a low state "L". At this time, a command signal COMMAND and a write command signal WR are activated.

The operation of the semiconductor memory device input circuit according to the present invention will be described with reference to FIGS. 2 and 3.

The clock selection circuit 210 is maintained at a predetermined first logic level (CL 1="H") during a predetermined time interval from the time when power is initially turned on and receives the selection signal CL1 having a second logic level (CL1="L") opposite to the first logic level (CL1="H") after the predetermined time interval. The clock selection circuit 210 selects the first clock signal CLK and outputs it as the second clock signal SCLK when the selection signal CL1 is maintained at the first logic level (CL1="H"). The clock selection circuit 210 selects the data strobe signal DQS and outputs it as the second clock signal SCLK when the selection signal CL1 is maintained at the second logic level (CL1="L").

The calibration circuit 209 receives the second clock signal SCLK, calibrates the second clock signal SCLK to synchronize the input data D0, D1 through Di with the received second clock signal SCLK, and then outputs the controlling clock signal. If the input data provided through the input buffer are stored in the corresponding registers according to the controlling clock signal of the calibration circuit 209, the input data can be stored in the corresponding registers without any error even if the setup/hold window of a high speed semiconductor memory device is small.

The reference voltage Vref and the inverted signal CLKB of the first clock signal CLK, which are shown in FIG. 2, may be not used as occasion demands for selecting the clock signal.

As described above, the semiconductor memory device input circuit including the clock selection circuit according to the present invention and a method for selecting the clock signal is provided. The input circuit allows the input data to be stored in the registers regardless of the time interval when the operation of the semiconductor memory device is performed.

While this invention has been particularly shown and described with reference to certain embodiments, it will be understood by those skilled in the art that various changes in form and details may be made therein without departing from the spirit and scope of the invention as defined by the appended claims.

What is claimed is:

1. An input circuit, comprising:
   a plurality of input buffers adapted to buffer corresponding input data;
   a clock selection circuit adapted to generate a second clock signal by selecting between a first clock signal and a data strobe signal responsive to a selection signal, the selection signal changing states responsive to a mode register set signal operative a predetermined time after power up and before a read/write command is active;

a calibration circuit adapted to generate a register clock signal responsive to the second clock signal; and a plurality of data registers adapted to store buffered input data responsive to the register clock signal.

2. The input circuit of claim 1 where the clock selection circuit outputs the first clock signal as a second clock signal when the selection signal is at a first logic level; and where the clock selection circuit outputs the data strobe signal as the second clock signal when the selection signal is at a second logic level.

3. The input circuit of claim 2 where the predetermined time is a time between power up and a mode register set signal being enabled.

4. The input circuit of claim 2 where the predetermined time is a time between power up and the data strobe signal being enabled.

5. The input circuit of claim 1 where the clock selection circuit is adapted to select between a voltage reference and an inverted first clock signal responsive to the selection signal.

6. An input circuit, comprising:

a plurality of input buffers adapted to buffer corresponding input data;

a clock selection circuit adapted to generate a second clock signal by selecting between a first clock signal and a data strobe signal responsive to a selection signal, the selection signal being maintained at a first logic level for a predetermined time after power up;

a calibration circuit adapted to generate a register clock signal responsive to the second clock signal; and a plurality of data registers adapted to store buffered input data responsive to the register clock signal;

where the clock selection circuit includes:

a first PMOS transistor having a first end connected to a supply voltage and a gate adapted to receive the selection signal;

a first buffer having a first input adapted to receive the data strobe signal, a second input adapted to receive a reference voltage, and a third input being connected to a second end of the first PMOS transistor;

a first NMOS transistor having a first end connected to an output terminal of the first buffer, a second end connected to ground, and a gate adapted to receive the selection signal;

a second buffer having a first input adapted to receive a the first clock signal and a second input adapted to receive an inverted first clock signal;

an inverter having an input terminal connected to the output terminal of the first buffer;

a first logic gate adapted to logically manipulate the selection signal and an output signal of the second buffer; and a second logic gate adapted to logically manipulate an output signal of the first logic gate and an output signal of the first inverter.

7. The input circuit of claim 6 where the clock selection circuit outputs the first clock signal as a second clock signal when the selection signal is at a first logic level; and where the clock selection circuit outputs the data strobe signal as the second clock signal when the selection signal is at a second logic level.

8. The input circuit of claim 7 where the predetermined time is a time between power up and a mode register set signal being enabled.

9. The input circuit of claim 7 where the predetermined time is a time between power up and the data strobe signal being enabled.

10. A method for selecting a clock signal in an input circuit for a semiconductor memory device, comprising:

generating a selection signal having a second logic state a predetermined time after power up and a first logic state after enabling a mode register set signal, the mode register set signal being active prior to a command signal being active;

providing a first clock signal as a second clock signal responsive to the selection signal being in the first logic state;

providing a data strobe signal as the second clock signal responsive to the selection signal being the second logic state;

generating a register clock signal responsive to the second clock signal; and registering the input data responsive to the register clock.

11. The method of claim 10 including setting the selection signal to the second logic state after enabling the data strobe signal.

* * * * *

UNITED STATES PATENT AND TRADEMARK OFFICE
CERTIFICATE OF CORRECTION

PATENT NO. : 6,696,862 B2  
DATED : February 24, 2004  
INVENTOR(S) : Choi et al.

It is certified that error appears in the above-identified patent and that said Letters Patent is hereby corrected as shown below:

Column 2,
Line 18, "signal. ¶ And a plurality" should read -- signal. And a plurality --.

Column 3,
Line 44, "data DO through" should read -- data D0 through --.

Column 4,
Line 11, "(e.g., 200 μSec)" should read -- (e.g., 200 μ Sec) --.

Column 6,
Line 4, "receive a the first clock" should read -- receive the first clock --.

Signed and Sealed this

Tenth Day of August, 2004

JON W. DUDAS
*Acting Director of the United States Patent and Trademark Office*